US011171472B2

(12) United States Patent
Kobayashi et al.

(10) Patent No.: US 11,171,472 B2
(45) Date of Patent: Nov. 9, 2021

(54) ELECTRONIC CONTROLLER

(71) Applicant: HITACHI AUTOMOTIVE SYSTEMS, LTD., Hitachinaka (JP)

(72) Inventors: Toru Kobayashi, Hitachinaka (JP); Masato Saito, Hitachinaka (JP); Michihito Watarai, Hitachinaka (JP)

(73) Assignee: HITACHI AUTOMOTIVE SYSTEMS, LTD., Ibaraki (JP)

(*) Notice: Subject to any disclaimer, the term of this patent is extended or adjusted under 35 U.S.C. 154(b) by 0 days.

(21) Appl. No.: 16/772,259

(22) PCT Filed: Dec. 4, 2018

(86) PCT No.: PCT/JP2018/044486
§ 371 (c)(1),
(2) Date: Jun. 12, 2020

(87) PCT Pub. No.: WO2019/131004
PCT Pub. Date: Jul. 4, 2019

(65) Prior Publication Data
US 2021/0104879 A1 Apr. 8, 2021

(30) Foreign Application Priority Data
Dec. 25, 2017 (JP) .............................. JP2017-248224

(51) Int. Cl.
*H02G 3/08* (2006.01)
*H02G 3/16* (2006.01)
(Continued)

(52) U.S. Cl.
CPC ............... *H02G 3/088* (2013.01); *H02G 3/16* (2013.01); *H05K 5/0039* (2013.01); *H05K 5/0213* (2013.01)

(58) Field of Classification Search
CPC .......... H02G 3/088; H02G 3/16; H02G 3/081; H02G 3/08; H05K 5/00; H05K 5/0039; (Continued)

(56) References Cited

U.S. PATENT DOCUMENTS 5,649,859 A * 7/1997 Shiga ..................... F24F 7/02
174/17 VA
5,692,637 A * 12/1997 Hodge ............... G01L 19/0636
174/17 VA (Continued)

FOREIGN PATENT DOCUMENTS

CN 102170764 A 8/2011
CN 202262171 U 5/2012
(Continued)

Primary Examiner — Angel R Estrada
(74) Attorney, Agent, or Firm — Volpe Koenig

(57) ABSTRACT

To make it possible to enhance waterproofness of a vent hole when an electronic controller is mounted on an automobile. The electronic controller includes a waterproof case that accommodates a printed circuit board with electronic parts mounted thereon, and a connector that electrically connects the printed circuit board and an external apparatus to each other, the electronic controller being mounted on the automobile in a posture having the connector directed downward. The waterproof case has an inclined surface that is smaller as the distance from a bottom surface is more on the connector side, and the inclined surface is formed with a vent hole that is closed with the breathing filter.

12 Claims, 4 Drawing Sheets

(51) Int. Cl.
*H05K 5/00* (2006.01)
*H05K 5/02* (2006.01)

(58) Field of Classification Search
CPC ...... H05K 5/0213; H05K 5/0004; H05K 5/02; H05K 5/0204; H05K 5/0217; H05K 5/0052
USPC ... 174/50, 520, 522, 17 R, 17 VA, 535, 559, 174/560, 564; 439/76.1, 76.2; 361/600, 361/601, 676, 641; 454/184
See application file for complete search history.

(56) References Cited

U.S. PATENT DOCUMENTS

| | | | | |
|---|---|---|---|---|
| 6,144,522 | A * | 11/2000 | Myokan | G11B 25/043 360/97.16 |
| 6,506,110 | B1 * | 1/2003 | Borisch | H05K 5/0213 174/17 VA |
| 6,600,653 | B2 * | 7/2003 | Koike | H05K 5/0043 174/535 |
| 7,151,674 | B2 * | 12/2006 | Sasaki | B60R 16/0239 361/752 |
| 7,189,918 | B2 * | 3/2007 | Sakata | B60R 16/0239 174/17 VA |
| 7,253,356 | B2 * | 8/2007 | Kiyota | H02G 3/081 174/17 R |
| 7,465,887 | B2 * | 12/2008 | Suzuki | H05K 5/0047 174/520 |
| 7,667,973 | B2 * | 2/2010 | Shinoda | H05K 5/068 174/50 |
| 9,832,567 | B2 * | 11/2017 | Zhang | H05K 5/0217 |
| 2008/0074840 | A1 | 3/2008 | Suzuki | |
| 2011/0211311 | A1 | 9/2011 | Shinoda | |
| 2013/0335919 | A1 | 12/2013 | Shinoda | |

FOREIGN PATENT DOCUMENTS

| | | |
|---|---|---|
| FR | 2932784 A1 | 12/2009 |
| JP | 2004-356524 A | 12/2004 |
| JP | 2004-357462 A | 12/2004 |
| JP | 2006-005162 A | 1/2006 |
| JP | 2008-078506 A | 4/2008 |
| JP | 2014-209639 A | 11/2014 |
| JP | 2016-063652 A | 4/2016 |

* cited by examiner

ELECTRONIC CONTROLLER

TECHNICAL FIELD

The present invention relates to an electronic controller mounted on an automobile.

BACKGROUND ART

For example, Patent Document 1 discloses an electronic controller mounted on an automobile. The electronic controller has a circuit board accommodated in a housing. The housing is formed with a vent hole, and a vent waterproof film is attached to an inside opening part of the vent hole.

PRIOR ART DOCUMENT

Patent Document

Patent Document 1: JP-2014-209639-A

SUMMARY OF THE INVENTION

Problem to be Solved by the Invention

The vent hole in Patent Document 1 is provided in an inclined wall section which is larger as the distance from a mounting surface of the electronic controller for mounting to the automobile is more on a connector side. Therefore, the housing is integrally formed with a protective wall for covering the vent hole, so as to prevent water or the like from penetrating into the vent hole, in the case of mounting the electronic controller to the automobile in a posture having the connector directed downward.

The present invention has been made in consideration of the above-mentioned circumstances. It is an object of the present invention to provide an electronic controller which, when mounted on an automobile, is able to enhance waterproofness of a vent hole.

Means for Solving the Problem

An electronic controller according to one aspect for solving the above-mentioned problem is an electronic controller including: a housing that accommodates a substrate with an electronic part mounted thereon; and a connector that electrically connects the substrate and an external apparatus to each other, the electronic controller mounted on an automobile in a posture having the connector directed downward. In the electronic controller, the housing has an inclined surface that is smaller as distance from a mounting surface for mounting to the automobile is more on the connector side, and the inclined surface is formed with a vent hole that is closed with a breathing filter.

Effect of the Invention

According to the present invention, waterproofness of a vent hole when an electronic controller is mounted on an automobile can be enhanced.

MODES FOR CARRYING OUT THE INVENTION

Some embodiments will be described in detail, using the drawings. Note the embodiments described below do not limit the invention according to the claims, and all the elements and combinations thereof described in the following embodiments are not necessarily indispensable to the solving means of the invention.

Embodiment 1

Figure 1:
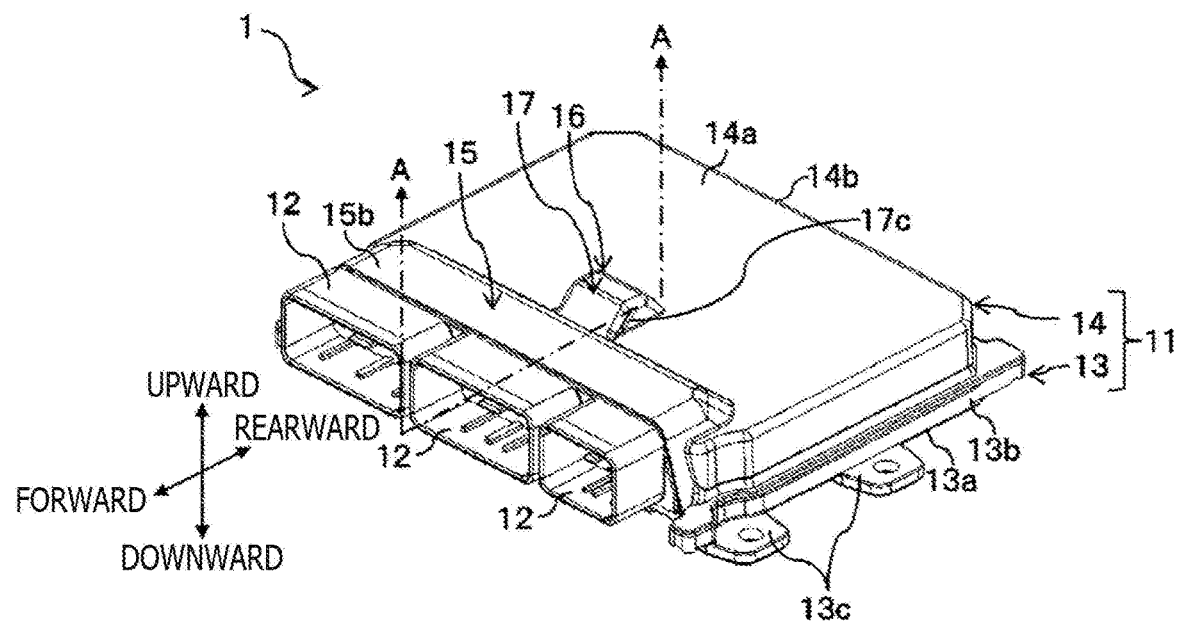
FIG. 1 is a perspective view of an electronic controller according to Embodiment 1.

FIG. 1 is a perspective view of an electronic controller according to Embodiment 1. In FIG. 1, the connecting direction of a connector is taken as a forward direction, the direction of a mounting surface of the electronic surface for mounting onto an automobile is taken as a downward direction, and the direction along the mounting surface and orthogonal to the forward direction is taken as a width direction, in making description. The electronic controller of the present embodiment is mounted on the automobile in a posture having the connector directed downward.

The electronic controller 1 has a configuration in which an engine ECU (Electronic Control Unit) as an electronic device to be mounted on a vehicle is accommodated in a waterproof case 11 as an example of "housing."

The waterproof case 11 is molded from a synthetic resin or the like, and includes a waterproof base 13, and a waterproof cover 14 joined to the waterproof base 13. The waterproof base and the waterproof cover 14 are assembled substantially in the shape of a rectangular parallelepiped opened at one side surface. Through the opening at the onside surface, terminals in connector housings of a plurality of connectors 12 are exposed to the exterior. Each of the connectors 12 electrically connects a printed circuit board 10 and an external apparatus to each other.

The waterproof base 13 has a rectangular bottom surface 13a, and side surfaces 13b erected from outer peripheral edges (each of end edges) of the bottom surface 13a. The base surface 13a serves as a mounting surface of the electronic controller 1 for mounting to an automobile which is not illustrated. Two brackets 13c for mounting the electronic controller 1 to the vehicle which is not illustrated are provided at each of both outside edges in regard of the width direction of the side surfaces 13b.

The waterproof cover 14 has a substantially rectangular upper surface 14a, and side surfaces 14b erected from outer peripheral edges (each of end edges), exclusive of the connector side, of the upper surface 14a. The upper surface 14a is integrally formed with a projection 16 at a central portion, a connector accommodating section 15 at a front end, and a protective section 17 at a front side adjacently to the projection, in the manner of projecting in directions for spacing away from the mounting surface.

Figure 2:
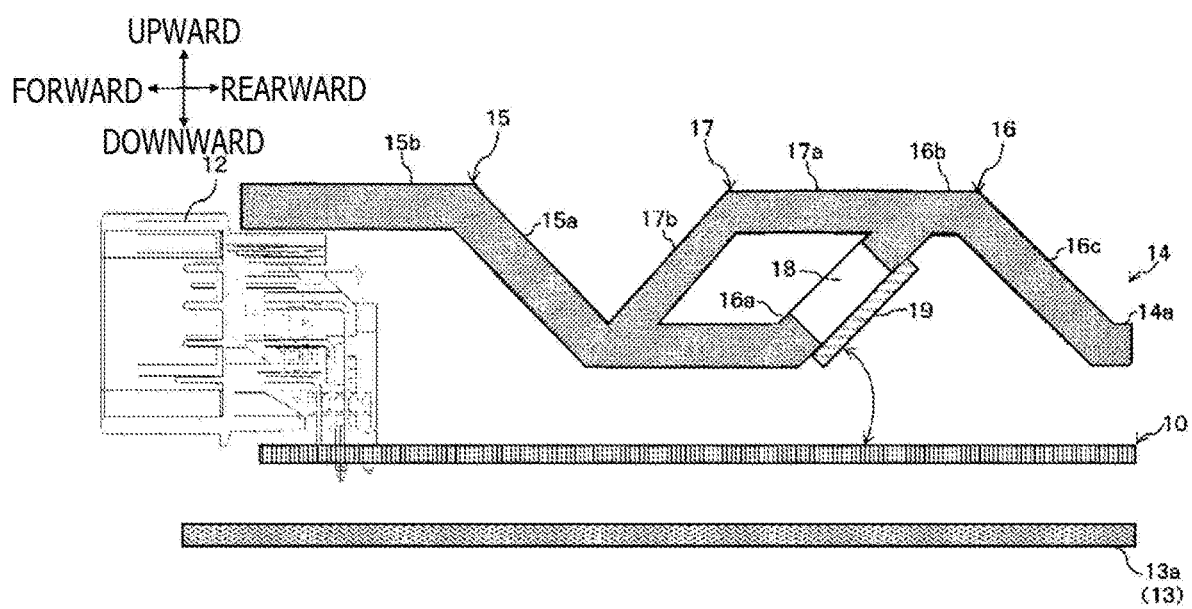
FIG. 2 is a sectional view taken along line A-A of FIG. 1.

FIG. 2 is a sectional view taken along line A-A of FIG. 1.

Electronic parts which are not illustrated are mounted on the printed circuit board 10. Further, the connector 12 is mounted to the front end of the printed circuit board 10. An electronic section which is not illustrated is also mounted on the printed circuit board 10. The printed circuit board 10 is fixed by small screw or the like to a fixation section provided on a back surface of the bottom surface 13a of the waterproof base 13, in the state of being slightly spaced from the back surface of the bottom surface 13a.

The projection 16 is substantially in the shape of a truncated tetragonal pyramid. The projection 16 integrally has an inclined front surface 16a as an example of an "inclined surface" extended rearward and upward, a top surface 16b extended rearward from a rear end edge of the inclined front surface 16a, and an inclined rear surface 16c extended rearward and downward from a rear end edge of the top surface 16b.

The inclined front surface 16a is smaller as the distance from the bottom surface 13a is more on the connector 12 side.

The inclined rear surface 16c is formed rearward and downward from the rear end edge of the top surface 16a to the upper surface 14a.

The inclined front surface 16a is provided with a breathing hole 18, for eliminating an air pressure difference between the inside and the outside of the waterproof case 11. The breathing hole 18 penetrates the inclined front surface 16a in a plate thickness direction. The breathing hole 18 is oriented forward and upward. A thin film formed breathing filter 19 of Gore-Tex (registered trademark) or the like for preventing penetration of dust or penetration of water is welded to the breathing hole 18 from the inside of the waterproof case 11. Therefore, the breathing hole 18 is closed with the breathing filter 19 from the inside of the waterproof case 11.

Like the inclined front surface 16a, the breathing filter is smaller as the distance from the bottom surface 13a is more on the connector 12 side.

The inclination angle 20 of the inclined front surface 16a relative to the bottom surface 13a is approximately 45 degrees. This is not limitative, and the inclination angle 20 of the inclined front surface 16a relative to the bottom surface 13a may be 30 to 60 degrees.

The top surface 16b is disposed on the opposite side of the bottom surface with respect to the printed circuit board 10.

The connector accommodating section 15 integrally has an inclined surface 15a extended forward and upward, and a connector accommodating surface 15b. The connector accommodating surface 15b projects toward the side of spacing away from the bottom surface 13a to such a height that a connector housing of the connector 12 can be accommodated. The connector accommodating surface 15b projects toward the side of spacing away from the bottom surface 13a to the same height as the top surface 16b.

The protective section 17 covers the vent hole 18 from outside the waterproof case 11. The protective section 17 has an extension surface 17a extended from a front end edge of the top surface 16b toward the connector accommodating surface 15b, an inclined surface 17b extended forward and downward from a front end edge of the extension surface 17a, a left side surface, and a right side surface.

The extension surface 17a projects toward the side of spacing away from the bottom surface 13a to the same height as the top surface 16b and the connector accommodating surface 15b.

The inclined surface 17b is formed forward and downward from a front end edge of the extension surface 17a to the upper surface 14a.

Belt-shaped slits 17c (see FIG. 1) along the inclined surface 17b are provided on the front side of the left side surface and the right side surface. The slits 17c penetrate the left side surface and the right side surface in a plate thickness direction.

Here, the electronic controller 1 to be mounted on a vehicle is mounted inside an engine room of the automobile. Therefore, the electronic controller 1 is exposed to a use environment in which penetration of dust and penetration of water are liable to occur.

Figure 3:
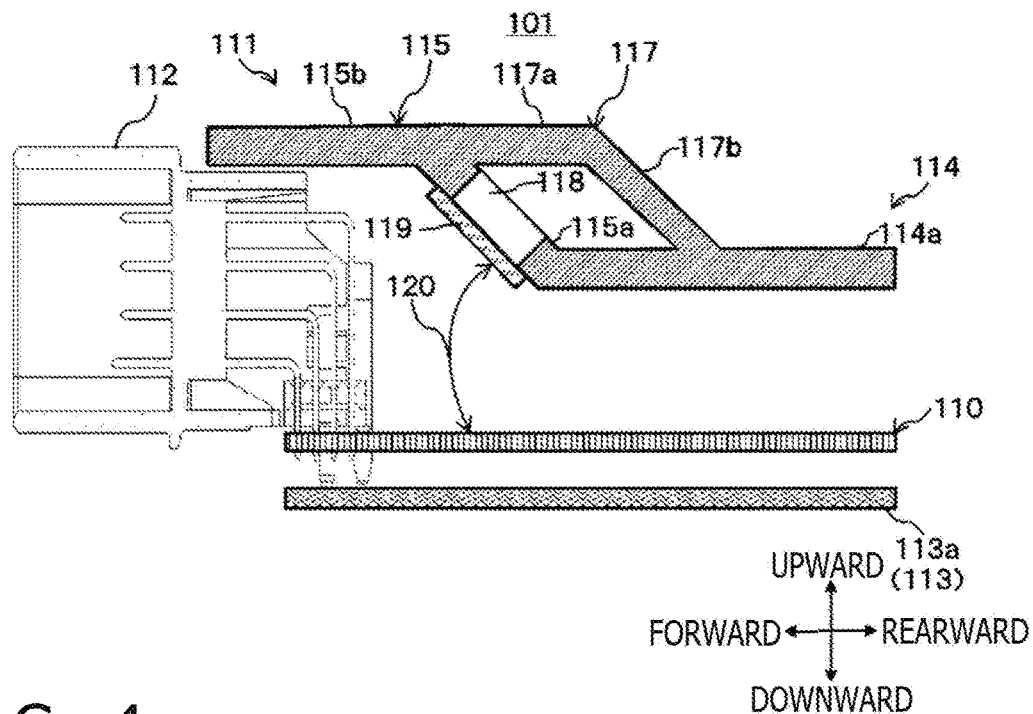
FIG. 3 is a sectional view of a conventional electronic controller.

FIG. 3 is a sectional view of a conventional electronic controller.

The conventional electronic controller 101 has a configuration in which a vent hole 118 closed with a breathing filter 119 is formed in an inclined surface 115a of a connector accommodating section 115, and the vent hole 118 is covered with a protective section 117 from outside a waterproof case 111.

The electronic controller 101 is mounted inside the engine room of a vehicle in a posture of having a connector 112 directed downward. When the electronic controller 101 is mounted inside the engine room in the posture of having the connector 112 directed downward, the vent hole 118 opens upward, with its lower side closed with a breathing filter 119. Therefore, water is liable to penetrate into the vent hole 118, and, in the case where the vent hole 118 is flooded, the breathing filter 119 becomes unable to breath, and an air pressure difference may be generated between the inside and the outside of the waterproof case 111.

On the other hand, when the electronic controller 1 of Embodiment 1 is mounted inside the engine room in the posture of having the connector 12 directed downward, the vent hole 18 opens downward, with its upper side closed with the breathing filter 19. Therefore, the vent hole 18 is not liable to be flooded with the water penetrating into the vent hole 18, so that a situation in which the breathing filter 19 becomes unable to breath can be prevented from occurring.

This configuration ensures that when the electronic controller 1 is mounted in the engine room in the posture of having the connector 12 directed downward, the vent hole 18 is directed downward, so that the water penetrating into the vent hole 18 can be prevented from easily collecting on the breathing filter 19. Therefore, waterproofness of the vent hole 18 can be enhanced.

Further, since the breathing filter 19 is disposed on the inner side of the waterproof case 11 than the top surface 16b, the vent hole 18 can be protected by the top surface 16b.

Furthermore, since the waterproof case 11 has the connector accommodating surface 15b which projects toward the side of spacing away from the bottom surface 13a and in which part of the connector 12 is accommodated, the vent hole 18 can be disposed between the top surface 16b and the connector accommodating surface 15b, and, while protecting the vent hole by the top surface 16b and the connector accommodating surface 15b, the electronic controller 1 can be restrained from being caught on the inclined front surface 16a at the time of mounting the electronic controller 1 inside the engine room.

Further, since the inclination angle of the inclined front surface 16a relative to the bottom surface 13a is approximately 45 degrees, waterproofness of the vent hole 18 can be enhanced, and the degree of freedom in the mounting posture of the electronic controller 1 can be enhanced, while securing the internal volume of the waterproof case 11.

Furthermore, since the protective section 17 has the extension surface 17a extended from the top surface 16b toward the connector accommodating surface 15b, the vent hole 18 can be protected by the protective surface 17a.

Further, since the vent hole 18 is closed with the breathing filter 19 from inside the waterproof case 11, the breathing filter 19 can be mounted to the vent hole 18 even if the protective section 17 for covering the vent hole 18 is molded integrally with the upper surface 14a.

Embodiment 2

Next, an electronic controller 2 according to Embodiment 2 will be described. Note that the electronic controller 2 according to Embodiment 2 differs from the electronic controller according to Embodiment 1 only in the configuration of the upper surface of the waterproof cover, and is similar to the electronic controller 1 according to Embodiment 1 in other configurations. Therefore, the difference from Embodiment 1 will be described primarily.

Figure 4:
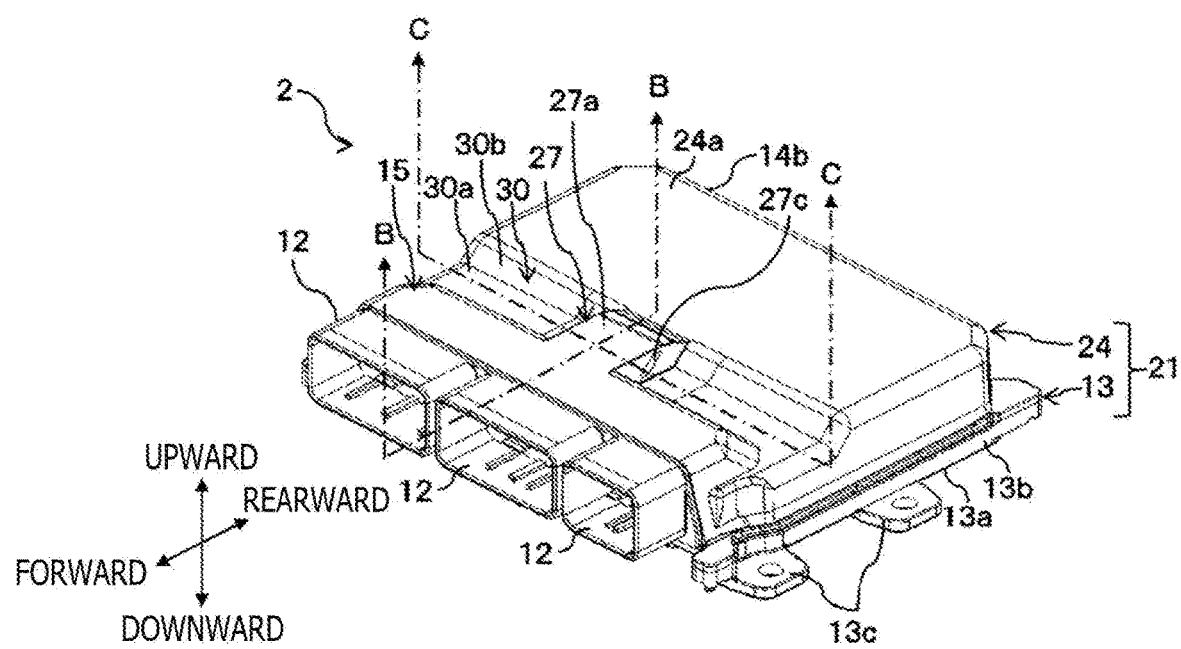
FIG. 4 is a perspective view of an electronic controller according to Embodiment 2.
Figure 5:
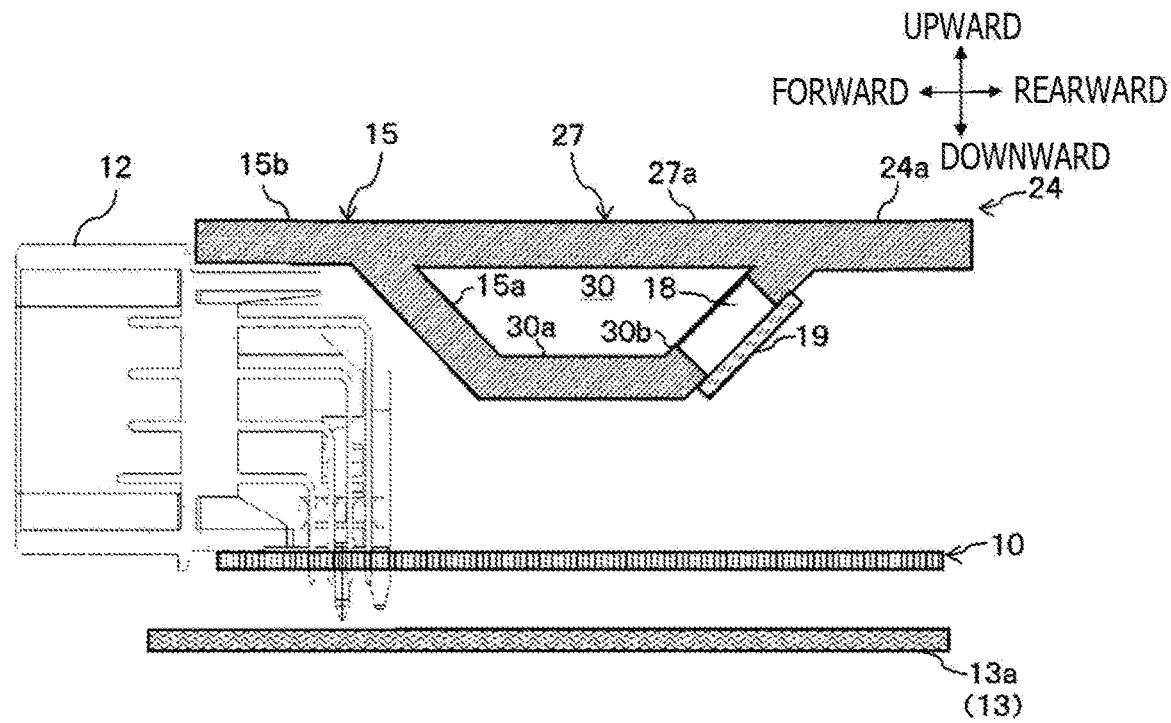
FIG. 5 is a sectional view taken along line B-B of FIG. 4.

FIG. 4 is a perspective view of the electronic controller according to Embodiment 2. FIG. 5 is a sectional view taken along line B-B of FIG. 4.

A waterproof case 21 of the electronic controller 2 has a waterproof cover 24. The waterproof cover 24 has an upper surface 24a as an example of a "top surface." At a position nearer to the front side than a central portion in regard of the front-rear direction of the upper surface 24a, a pair of drain grooves 30 for draining water present in a vent hole 18 are formed. Further, a protective section 27 covering the vent hole 18 from outside the waterproof case 11 is integrally formed at a central portion (between both the drain grooves 30) of the upper surface 24a.

The pair of drain grooves 30 are formed on both sides of the vent hole 18. The drain grooves 30 are each extended to an outside edge in regard of the width direction of the waterproof case 21. The drain groove 30 is formed in a trapezoidal sectional shape, by an inclined surface 15a of a connector accommodating section 15, a bottom surface 30a extended rearward from a rear end edge of the inclined surface 15a, and an inclined surface 30b extended rearward and upward from a rear end edge of the bottom surface 30a.

Figure 6:
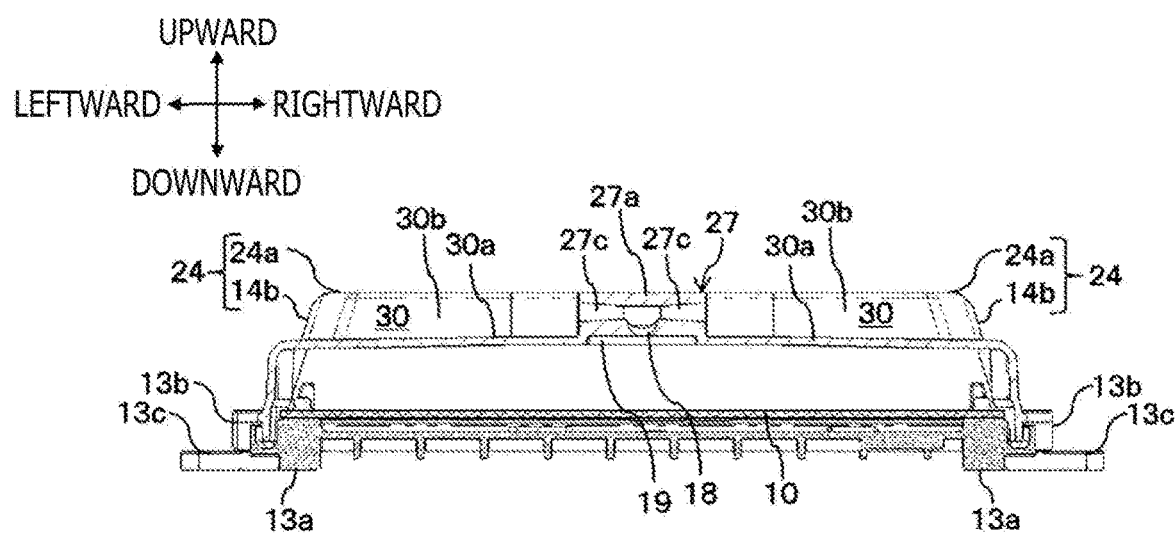
FIG. 6 is a sectional view taken along line C-C of FIG. 4.

FIG. 6 is a sectional view taken along line C-C of FIG. 4.

The inclined surface 30b is formed with a breathing hole 18 which is closed with a breathing filter 19 from inside the waterproof case.

Inner surfaces of the drain groove 30, namely, the inclined surface 15a, the bottom surface 30a and the inclined surface 30b are formed in an inverse tapered shape broadening in going toward an outer edge side in regard of the width direction of the waterproof case 21. The taper angle is approximately 2 degrees.

The protective section 27 is substantially in the shape of an inverted truncated tetragonal pyramid which projects in the direction of spacing away from a bottom surface 13a. The protective section 27 has a connection surface 27a extended rearward from a central portion in regard of the width direction of a connector accommodating surface 15b, a left side surface, and a right side surface. The connection surface 27a is connected to the connector accommodating surface 15b.

Each of the left side surface and the right side surface is provided with a belt-shaped slit 27c (see FIG. 4) as an example of a "drain hole" along the inclined surface 30b of the drain groove 30. The slits 27c penetrate the left side surface and the right side surface in a plate thickness direction. The slits 27c establishes communication between the vent hole 18 and the drain grooves 30. An inner peripheral surface of the slit 27c has an inverse tapered shape broadening in going toward the drain groove side 30. The taper angle is approximately 2 degrees, like in the drain groove 30.

According to this configuration, the upper surface 24a of the waterproof case 21 is formed with the drain grooves 30 which are extended to an outside edge in regard of the width direction of the waterproof case 21 and by which water in the vent hole is drained. The inner surfaces of the drain groove 30, namely, the inclined surface 15a, the bottom surface 30a and the inclined surface 30b are formed in the inverse tapered shape broadening in going to the outer edge side of the waterproof case 21. As a result, easy discharge of water having penetrated into the vent hole 18 can be realized. Since the vent hole can be formed in part of the inner surfaces of the drain groove 30, it is unnecessary to newly provide an inclined surface.

Further, since the drain grooves 30 are formed on both sides of the vent hole 18 of the waterproof case 21, the drain grooves 30 can be easily formed by drawing molds to both lateral sides. Since the length of the inclined surface 30b can be secured, it is ensured that, while protecting the vent hole 18 by the upper surface 24a, the electronic controller 1 can be restrained from being caught on the inclined surface 30b at the time of mounting the electronic controller 1 inside an engine room.

Furthermore, since the protective section 27 is formed with slits 27e communicating with the drain grooves 30 and the inner peripheral surface of the slit 27e is formed in an inverse tapered shape broadening in going toward the outer end edge side in regard of the width direction of the waterproof case 21, discharge property for water having penetrated into the vent hole 18 can be enhanced, while restraining water from penetrating into the inside of the protective section 27.

Further, since the protective section 27 has the connection surface 27a connected to the rear end edge of the connector accommodating surface 15b, the breathing filter 19 can be protected, while restraining water from penetrating into the vent hole 18.

Embodiment 3

Next, an electronic controller 3 according to Embodiment 3 will be described. Note that the electronic controller 3 according to Embodiment 3 differs from the electronic controller according to Embodiment 2 only in the configurations of the upper surface of the waterproof cover and the breathing filter, and are similar to the electronic controller 2 according to Embodiment 2 in other configurations. Therefore, the difference from Embodiment 2 will be described primarily.

Figure 7:
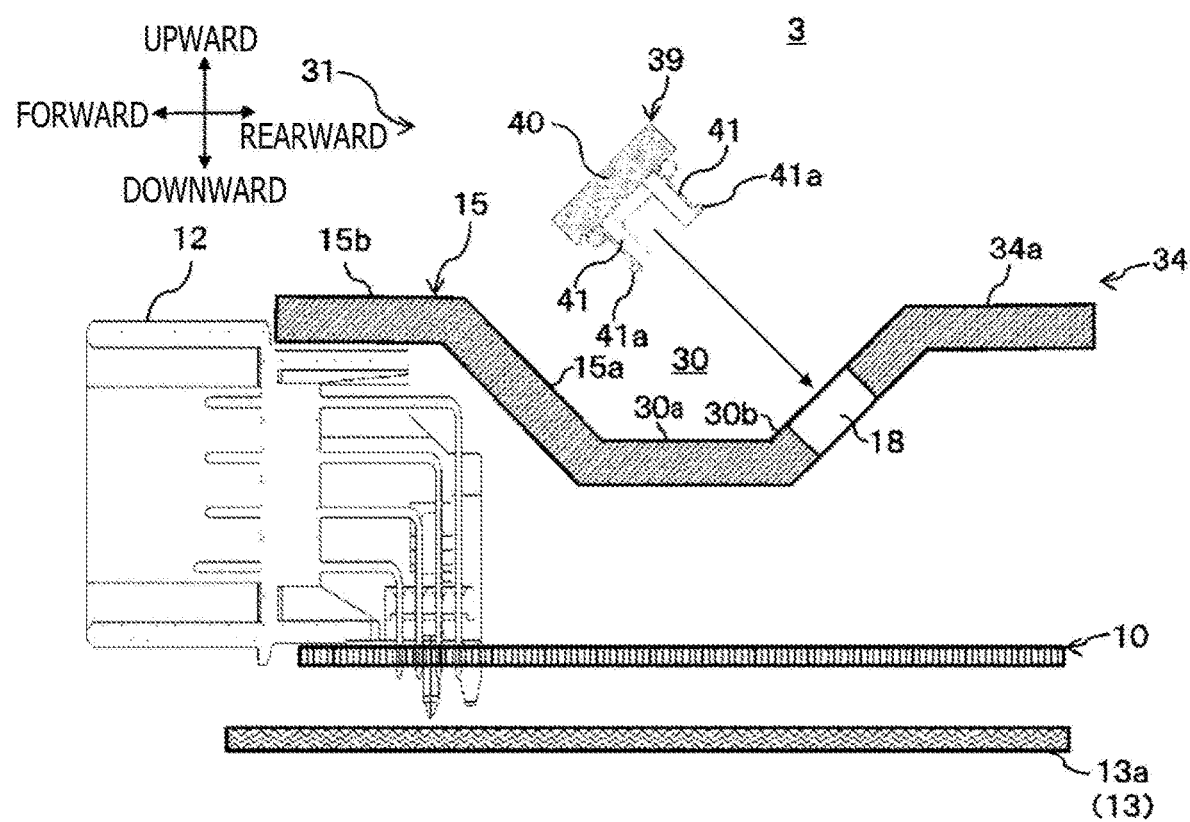
FIG. 7 is a sectional view of an electronic controller according to Embodiment 3.

FIG. 7 is a sectional view of the electronic controller according to Embodiment 3.

A protective section 27 is not provided at an upper surface 34a of a waterproof cover 24 possessed by the electronic controller 3, and a breathing filter 39 is mounted to a vent hole 18 formed in an inclined surface 30b, from outside a waterproof case 31.

Specifically, the breathing filter 39 includes a filter main body 40, and a plurality of hooks 41 for mounting the filter main body 40 to the vent hole 18.

Each of the hooks 41 is flexible. Each hook 41 is provided at its tip with a locking claw 41a projecting toward the outside.

In the breathing filter 39 configured in this way, the hooks 41 are inserted into the vent hole 18 from outside the waterproof case 31. In this instance, each hook 41 is elastically deformed such that the hooks 41 approach one another, after which each hook 41 is recovered to its original position when the locking claws 41*a* pass through inner peripheral edges of the vent hole 18. As a result, the locking claws 41*a* are locked on the inner peripheral edges of the vent hole 18. In this way, the filter main body 40 is mounted to the outside of the vent hole 18.

According to this configuration, since the breathing filter 39 includes the filter main body 40 and the hooks 41 for mounting the filter main body 40 to the vent hole 18, the breathing filter 39 can be easily attached and detached.

The hooks 41 are flexible, and, after the hooks 41 are locked to the vent hole 18 by being inserted into the vent hole 18 from outside, the vent hole 18 is closed with the filter main body 40 from outside the waterproof case 31. Therefore, the breathing filter 39 can be easily attached to and detached from the outside of the vent hole 18.

The present invention is not limited to the above-described embodiments, but includes various modifications.

For example, in Embodiment 1 described above, the waterproof case 11 has been formed with the protective section 17, and, in Embodiment 2, the waterproof case 21 has been formed with the protective section 27. However, this is not restrictive, and the waterproof cases 11 and 21 may not necessarily be formed with the protective sections 17 and 27.

DESCRIPTION OF REFERENCE CHARACTERS

1: Electronic controller
2: Electronic controller
3: Electronic controller
10: Printed circuit board
11: Waterproof case
12: Connector
13*a*: Bottom surface
15*a*: Inclined surface
15*b*: Connector accommodating surface
16*a*: Inclined surface
16*b*: Top surface
17: Protective section
17*a*: Extension surface
18: Vent hole
19: Breathing filter
21: Waterproof case
24*a*: Upper surface
27: Protective section
27*a*: Connection surface
27*c*: Slit
30: Drain groove
30*a*: Bottom surface
30*b*: Inclined surface
31: Waterproof case
39: Breathing filter
40: Filter main body
41: Hook

The invention claimed is:

1. An electronic controller comprising:
a housing that accommodates a substrate with an electronic part mounted thereon; and
a connector that electrically connects the substrate and an external apparatus to each other, the electronic controller mounted on an automobile in a posture having the connector directed downward, wherein
the housing has a top surface and an inclined surface that is inclined with respect to the top surface, the inclined surface being closer to a mounting surface for mounting the electronic controller to the automobile at the connector side than the distance the inclined surface is from the mounting surface at the opposite side of the electronic controller from the connector side, and
the inclined surface is formed with a vent hole that is closed with a breathing filter.

2. The electronic controller according to claim 1, wherein
the housing has a top surface on an opposite side of the mounting surface with respect to the substrate, and
the breathing filter is disposed on an inner side of the housing as compared to the top surface.

3. The electronic controller according to claim 2, wherein
the housing has a connector accommodating surface which projects to a side for spacing away from the mounting surface and in which at least part of the connector is accommodated.

4. The electronic controller according to claim 3, wherein
the housing is further formed with a drain groove that is extended to an outer end edge of the housing and that drains water in the vent hole, and
an inner surface of the drain groove is formed in an inverse tapered shape broadening toward the outer end edge.

5. The electronic controller according to claim 4, wherein
the drain grooves are formed on both sides of the vent hole of the housing.

6. The electronic controller according to claim 5, wherein
the housing is further formed with a protective section that covers the vent hole from outside the housing,
the protective section is formed with a drain hole communicating with the drain groove, and
an inner peripheral surface of the drain hole is formed in an inverse tapered shape broadening toward the outer end edge of the housing.

7. The electronic controller according to claim 6, wherein
the protective section has a connection surface for connection to the connector accommodating surface.

8. The electronic controller according to claim 1, wherein
the breathing filter includes
a filter main body, and
a hook that mounts the filter main body to the vent hole.

9. The electronic controller according to claim 8, wherein
the hook is flexible and is locked to the vent hole by being inserted into the vent hole from outside the housing, and
the vent hole is closed with the filter main body from outside the housing when the hook is locked to the vent hole.

10. The electronic controller according to claim 1, wherein
an inclination angle of the inclined surface relative to the mounting surface is approximately 45 degrees.

11. The electronic controller according to claim 3, wherein
the housing is further formed with a protective section that covers the vent hole from outside from outside the housing, and
the protective section has an extension surface extended from the top surface toward the connector accommodating surface.

12. The electronic controller according to claim 7, wherein the vent hole is closed with the breathing filter from inside the housing.

* * * * *